United States Patent [19]

Lasky

[11] Patent Number: 4,735,679

[45] Date of Patent: Apr. 5, 1988

[54] METHOD OF IMPROVING SILICON-ON-INSULATOR UNIFORMITY

[75] Inventor: Jerome B. Lasky, Essex Junction, Vt.

[73] Assignee: International Business Machines Corporation, Armonk, N.Y.

[21] Appl. No.: 31,809

[22] Filed: Mar. 30, 1987

[51] Int. Cl.[4] .................. H01L 21/08; H01L 21/302; B24B 1/00

[52] U.S. Cl. ............................ 156/636; 156/645; 156/648; 156/656; 156/657; 156/662; 51/317; 437/62; 437/233; 437/245; 437/249; 437/966; 437/974

[58] Field of Search ............... 156/636, 645, 648, 649, 156/656, 657, 662; 51/281 R, 317; 437/61, 62, 228, 233, 249, 245, 966, 974

[56] References Cited

U.S. PATENT DOCUMENTS

| | | |
|---|---|---|
| 3,009,841 | 11/1961 | Faust ................................... 437/139 |
| 3,386,864 | 6/1968 | Silvestri et al. ....................... 437/62 |
| 3,740,280 | 6/1973 | Ronen .............................. 156/643 X |
| 3,911,562 | 10/1975 | Youmans ............................ 437/79 |
| 3,979,237 | 9/1976 | Marcom et al. .................... 156/645 |
| 4,037,306 | 7/1977 | Gutteridge et al. .................. 437/54 |
| 4,057,939 | 11/1977 | Basi ................................... 51/281 R |
| 4,233,091 | 11/1980 | Kawabe .............................. 437/68 |
| 4,571,819 | 2/1986 | Rogers et al. .................... 156/653 X |
| 4,596,071 | 6/1986 | Kita ............................... 156/648 X |
| 4,601,779 | 7/1986 | Abernathey et al. ............... 156/628 |

FOREIGN PATENT DOCUMENTS 023146 1/1981 European Pat. Off. .

OTHER PUBLICATIONS

F. E. Goetz and J. R. Hause, "Planetary 'Free' Wafer Polisher", IBM Technical Disclosure Bulletin, vol. 15, No. 6, dated Nov. 1972.

R. R. Shaw, R. R. Tummala, "Photosensitive Glass for Producing Recessed Metallurgy, Eliminating Need for Planarization", IBM Technical Disclosure Bulletin, vol. 26, No. 3A, dated Aug. 1983, p. 1094.

J. R. Kitcher, "Reactive Etch Process for Metal Wiring Using a Buried Mask", IBM Technical Disclosure Bulletin, vol. 23, No. 4, dated Sep. 1980, p. 1394.

C. H. Scrivner, "Polishing Technique to Remove Aluminum Lands from Semiconductor Chips", IBM Technical Disclosure Bulletin, vol. 24, No. 4, Sep. 1981.

C. H. Scrivner, "Test Site Failure Analysis: Two Levels of Metal for Isolation of Components", IBM Technical Disclosure Bulletin, vol. 20, No. 11A, Apr. 1978.

W. K. Chu, P. J. Tsang, R. C. Joy, "Process for Producing Dielectrically Isolated Single Crystal Silicon", IBM Technical Disclosure Bulletin, vol. 24, No. 9, Feb. 1982, pp. 4734–4735.

V. J. Silvestri, "Silicon on Insulator Processes for FET and Bipolar Device", IBM Technical Disclosure Bulletin, vol. 27, No. 8, Jan. 1985, pp. 4599–4604.

J. B. Laskey, "Wafer Bonding for Silicon on Insulator Technologies", Appl. Phys. Lett., 48(1), Jan. 6, 1986; pp. 78–80.

J. B. Laskey, S. R. Stiffer, F. R. White, J. R. Abernathey, "Silicon on Insulator (SOI) by Bonding and Etch-Back", IEDM 28.4, Dec. 1–4, 1985.

Copending U.S. Applications: Ser. No. 791,860, Beyer et al, "Chem-Mech Polishing Method for Producing Coplanar Metal/Insulator Films on Substrate", filed 10/28/85.

Copending U.S. Applications: Ser. No. 791,861, Beyer et al, "Method for Removing Protuberances at the Surface of a Semiconductor Wafer Using a Chem-Mech Polishing Technique", filed Oct. 28, 1985 and Ser. No. 791,887, Chow et al, "Method for Producing Coplanar Multi-Level/Insulator Films on a Substrate and for Forming Patterned Conductive Lines Simultaneously with Stud Vias", filed Oct. 28, 1985.

Primary Examiner—S. Leon Bashore
Assistant Examiner—Andrew J. Anderson
Attorney, Agent, or Firm—Sughrue, Mion, Zinn, Macpeak and Seas

[57] ABSTRACT

A method of improving silicon-on-insulator uniformity using polishing. A polishing stop layer of substantially uniform thickness is provided having a first side which is made coplanar with a first side of a thicker layer of semiconductor material. A polishing process is applied to a second side of the semiconductor material until a second side of the polishing stop layer is encountered, such that the substantially uniform thickness of the polishing stop layer can be used to define the semiconductor material to a layer of uniform thickness.

23 Claims, 2 Drawing Sheets

METHOD OF IMPROVING SILICON-ON-INSULATOR UNIFORMITY

CROSS-REFERENCE TO RELATED APPLICATIONS

Reference is made to co-pending U.S. patent application Ser. No. 791,860, entitled "Chem-Mech Polishing Method for Producing Coplanar Metal/Insulator Films On A Substrate," filed Oct. 28, 1985 by Beyer et al, and assigned to the assignee of the present application. This application is directed to forming apertures in an insulator layer, overfilling these apertures with metal, and polishing the metal back so that portions above the surface of the insulator layer are removed.

Reference is made to co-pending U.S. patent application Ser. No. 791,861, now U.S. Pat. No. 4,671,851, entitled "Method For Removing Protuberances At The Surface Of A Semiconductor Wafer Using A Chem-Mech Polishing Technique," filed Oct. 28, 1985 by Beyer et al, and assigned to the assignee of the present application. This application is directed to planarizing oxide protuberances by using a silicon nitride layer as an etch-stop.

Reference is made to co-pending U.S. patent application Ser. No. 791,887, entitled "Method For Producing Coplanar Multi-Level Metal/Insulator Films On A Substrate And For Forming Patterned Conductive Lines Simultaneously With Stud Vias," filed Oct. 28, 1985 by Chow et al, and assigned to the assignee of the present application. This application is directed to patterning a glass layer so that it simultaneously defines a wiring plane and an interconnection stud, filling the patterned glass with metal so as to form the structures, and polishing portions of the metal above the surface of the glass layer so that the metal is coplanar with the glass.

TECHNICAL FIELD

The present invention relates to a method of improving silicon-on-insulator uniformity.

BACKGROUND ART

In the present era of very large scale integrated (VLSI) circuits, there has been a trend toward shrinking the dimensions of transistors and other semiconductor structures to facilitate greater packing densities. With this shrinkage and denser packing of semiconductor devices, substrate leakage currents and device interactions have become a concern which require some form of isolation between devices.

A number of approaches has been proposed to provide this isolation. For example, U.S. Pat. No. 3,979,237, issued to Marcom et al, discloses a method of forming grooves in a semiconductor body, coating the grooves with an insulating layer, refilling the grooves with a silicon material, and then planarizing the top of the refilled grooves to ensure that the top of the silicon areas is planar. As a result, there are provided insulated grooves filled with semiconductor material.

A recent technology which appears to be particularly promising in providing greater isolation is that of a silicon-on-insulator (SOI) approach. For example, *IBM Technical Disclosure Bulletin*, Volume 24, No. 9, Feb. 1982, authored by Chu, Tsang, and Joy, discloses a method whereby isolated silicon regions are embedded in indentations in a dielectric substrate. Similarly, *IBM Technical Disclosure Bulletin*, Volume 27, No. 8, January 1985, authored by Silvestri, discloses a method of forming fully isolated epitaxial silicon growth regions on an insulator, which are then used to facilitate the construction of fully isolated FET, Bipolar, and MOSFET integrated circuits. Often in achieving the desired SOI structure, bonding methods are applied to fuse one silicon wafer to a second "Handle" wafer. Examples of these bonding methods can be seen in Laskey, "Wafer Bonding for Silicon-On-Insulator Technologies", *Appl. Phys. Lett.*, 48(1), 6 January 1986; and Laskey, White, Abernathey, "Silicon-On-Insulator (SOI) By Bonding and Etch-Back", IEDM 28.4, Dec. 1–4 1985.

One type of silicon-on-insulator construction with which the present invention is concerned is illustrated in, and will be described with reference to, FIGS. 1A and 1B. In FIG. 1A, a thin silicon layer 104 is on top of a thin insulator 102. The insulator layer 102 can be formed of any insulating material, and typically is silicon dioxide. Mechanical support and integrity are also provided by formation on a support body 100, which is typically a silicon wafer.

In FIG. 1B, the silicon-on-insulator layer of FIG. 1A has been masked, etched, and otherwise processed to provide isolated devices 110, 112, 114, and 116 formed on silicon islands 120, 122, 124, and 126, respectively. These silicon islands can be doped or otherwise treated to fabricate any of a multitude of semiconductor devices, for example, FET amplifiers, bipolar amplifiers, MOSFETs, etc. Note that the devices are totally isolated from one another, thereby preventing stray substrate leakage currents, and also preventing undesirable interactions between devices.

Also, note that the height of the device 112 is different from the height of devices 110, 114 and 116. This non-uniformity is due to the localized planar non-uniformity 106 indicated in FIG. 1A. As the device 112 has a shorter silicon island 122 than the silicon islands 120, 124 and 126 of the devices 110, 114, and 116, respectively, the device 112 effectively has a smaller silicon substrate area which produces a device 112 having operational parameters different from those of the devices 110, 114, and 116. In order to facilitate construction of semiconductor devices having substantially the same operational parameters, it would be desirable to have an SOI layer which has a planar top surface and is of uniform thickness.

It is also desirable to have an SOI layer with a planar top surface and a body of uniform thickness for several other reasons. First, projected photomask exposures may be slightly out of focus at localized planar non-uniformities. Second, if the tops of the resultant devices are planar, metalization wiring structure mask tolerances are somewhat relieved, and etch times to form stud-down structures to connect to the devices can be more accurately predicted.

FIG. 2A illustrates a silicon-on-insulator (SOI) having the desired characteristics of a planar top surface and a body of uniform thickness. In particular, a silicon layer 204 is on top of the insulator layer 102 which, in turn, is provided on top of the support body 100. In FIG. 2B, the silicon-on-insulator layer of FIG. 2A has been masked, etched, and otherwise processed to provide isolated devices 210, 212, 214 and 216 constructed on uniform silicon islands 220, 222, 224, and 226, respectively. Since the silicon islands 220, 222, 224, and 226 are uniform in thickness, the devices 210, 212, 214 and 216, respectively, have substantially similar operating parameters. Also, as the tops of the resultant devices are substantially planar, tolerance requirements in the end of the line processing to add a metalization wiring structure will be somewhat relaxed.

One prior art teaching which has achieved excellent results in producing a substantially uniform and planar SOI layer is that of U.S. Pat. No. 4,601,779, assigned to the present assignee, and issued to Abernathey et al. The resultant SOI structures by Abernathey et al serve as a preferred starting structure for the present invention, and as such, the teachings of Abernathey et al are incorporated herein by reference. However, there exists a need for a method which produces still greater planarity and thickness uniformity for silicon-on-insulator layers.

SUMMARY OF THE INVENTION

The present invention provides a method of polishing a silicon-on-insulator layer to satisfy the aforementioned needs.

More particularly, a silicon-on-insulator structure having improved planarity and thickness uniformity is produced by using a polishing stop layer of substantially uniform thickness. The polishing stop layer has a first surface which is coplanar with the first surface of a thicker layer of semiconductor material. The second surface of the thicker layer of semiconductor material is then chemically-mechanically polished in a planar mode to a point where the second surface of the thinner polishing stop layer is encountered. As a result, the substantially uniform thickness of the thinner stop layer is used to define the thicker semiconductor layer to a layer of uniform thickness.

Accordingly, the present invention relates to a process of planarizing a layer of material, comprising the steps of patterning said layer of material to form apertures therein; forming in each of said apertures a polishing stop layer of uniform thickness which is thinner than said layer of material; and polishing said layer of material to a point where its surfaces are substantially coplanar with the surfaces of said polishing stop layer, such that said uniform thickness of said polishing stop layer is used to define said layer of material to a layer of uniform thickness.

Thus, the broad object of the present invention is to provide an improved silicon-on-insulator fabrication process.

A second object of this invention is to provide a fabrication process whereby the top surface of a silicon-on-insulator layer can be polished to a surface which is substantially planar.

It is another object of this invention to provide a fabrication process whereby a silicon-on-insulator layer can be constructed to have a substantially uniform thickness.

It is an additional object of the invention to provide a fabrication process whereby a polishing process is used to improve the uniformity of a silicon-on-insulator layer.

It is a further object of the invention to provide a fabrication process whereby a thinner polishing stop layer of uniform thickness is used to define a thicker layer of semiconductor material to a layer of uniform thickness.

BRIEF DESCRIPTION OF THE DRAWINGS

The foregoing and other advantages, structures, and teachings of the present invention will become more apparent from the following detailed description of the preferred embodiment of the present invention. In the description to follow, reference will be made to the accompanying drawings, wherein.

DESCRIPTION OF THE PREFERRED EMBODIMENT

Figure 1A:
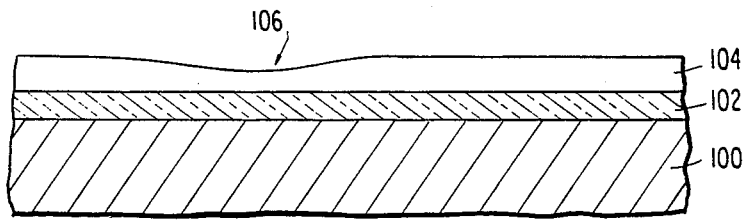
FIG. 1A is a simplified cross-sectional view of a prior art silicon-on-insulator structure having a localized planar non-uniformity.
Figure 1B:
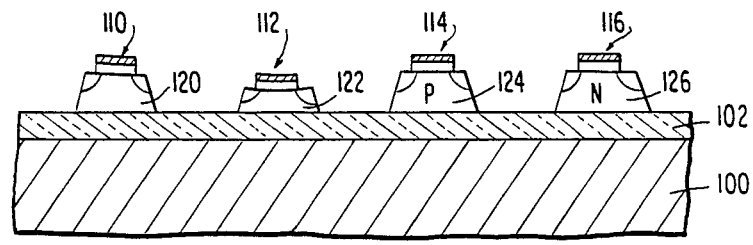
FIG. 1B is a simplified cross-sectional view of semiconductor devices formed from the silicon-on-insulator structure of FIG. 1.
Figure 2A:
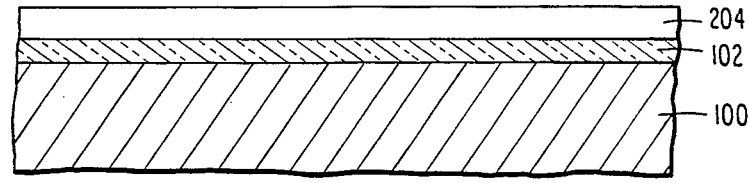
FIG. 2A is a simplified cross-sectional view of silicon-on-insulator structure having a top surface which is substantially planar, and a body which is of substantially uniform thickness.
Figure 2B:
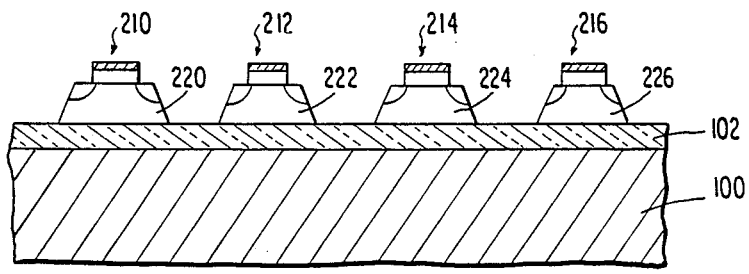
FIG. 2B is a simplified cross-sectional view of semiconductor devices formed from the silicon-on-insulator structure of FIG. 2A.
Figure 3A:
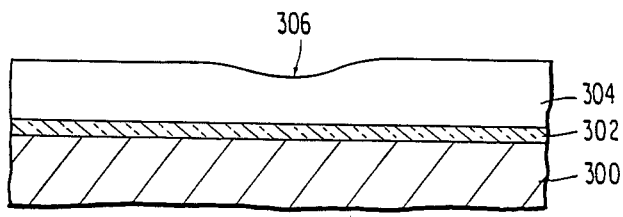
FIGS. 3A–3F are simplified cross-sectional views of a silicon-on-insulator structure being fabricated by a preferred embodiment of the process of the present invention.
Figure 3B:
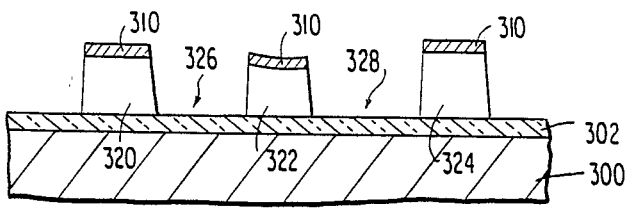
Figure 3C:
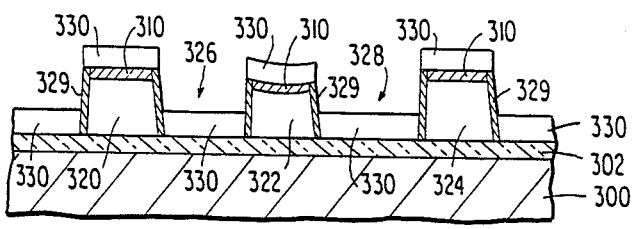
Figure 3D:
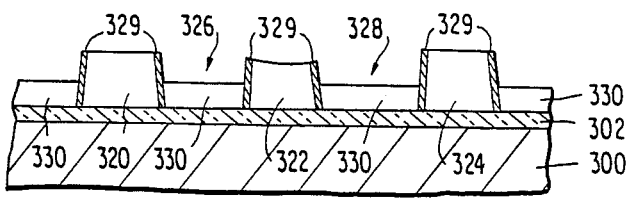
Figure 3E:
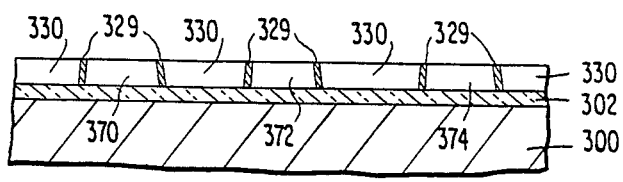
Figure 3F:
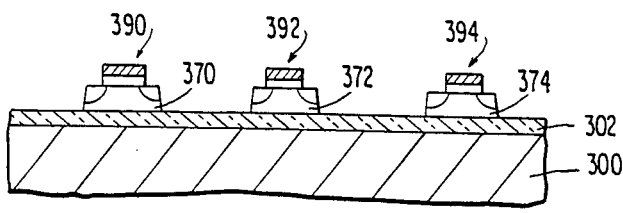

Turning now to a description of the present invention, FIGS. 3A and 3F will be used to illustrate and describe the processing steps in a preferred embodiment. It should be understood that the height, width and thickness dimensions shown in FIGS. 3A–3F are for the sake of example and clarity only, and are not intended to designate relative or actual dimensions; i.e., some dimensions may be exaggerated to improve the clarity of the illustrations. Typical dimensions, which are known, will be revealed in the written description.

Referring now to FIG. 3A, a simplified cross-section of an unprocessed prior art silicon-on-insulator structure is shown. More particularly, a silicon layer 304 is shown on an insulator layer 302 which, in turn, is on a support body 300. The insulator layer 302 is typically an oxide layer, and in a preferred embodiment is a silicon dioxide layer. The support body 300 provides support and integrity to the silicon-on-insulator layer, and is typically a silicon wafer. U.S. Pat. No. 4,601,779, referenced previously, discloses a preferred method of forming the SOI structure illustrated in FIG. 3A. Note that the silicon layer 304 has a localized planar non-uniformity 306. A typical thickness non-uniformity achievable by the forming method of this prior patent would be about a 0.2 micron variation.

Also, note that the bottom or first surface of the silicon layer 304 is in contact with the top surface of the insulator layer 302. As will become more apparent in the following discussion, the top surface of the insulator layer 302 is, in effect, used as a reference plane.

FIG. 3B is a simplified cross-sectional view of the silicon-on-insulator layer of FIG. 3A after it has been subjected to a first preferred processing step. More particularly, the silicon layer 304 has been processed by applying a resist layer 310 which is then masked and etched to define locations where isolated silicon bodies for device constructions are desired.

Once the resist layer has been masked and defined, the silicon layer 304 is then directionally etched down to the underlying insulator layer 302 to define the isolated silicon studs 320, 322, and 324. Any method of directionally etching the silicon layer 304 without disturbing the underlying insulator layer 302 can be used, for example, any well known RIE etch which provides a high etching selectivity between the silicon and the underlying oxide layer. An etchant providing this high etching selectivity is, in a preferred embodiment, a chlorine-based etchant.

After the etching of the silicon layer 304, the isolation regions formed between the silicon studs function as apertures to the underlying insulator layer 302. This function is important to the present invention in that the exposed portions of the top surface of the insulator layer 302 are again available to be used as a reference plane.

At this point, it should be noted that the processing steps described thus far are not critical to the present invention. They are merely meant to be exemplary of a preferred processing embodiment, and any method defining silicon bodies and apertures registered to the insulating layer 302 could easily be substituted to achieve excellent uniformity with the use of the present invention. Examples of alternative embodiments would include silicon strips separated by etched grooves, and a silicon plane bordered by an etched moat.

Returning to the illustrated embodiment and FIG. 3C, a thin insulator film 329 is then provided to coat the silicon studs, 320, 322, and 324. This insulator film 329 is important in protecting the exposed silicon stud sidewalls from chemical reactions in the processing steps to follow. An example of a suitable insulator film 329 would be a deposit of 200 Å of plasma enhanced chemical-vapor-deposited (PECVD) oxide.

Once the insulator film insulator 329 has been provided, a uniform layer 330 is directionally deposited to coat the tops of the silicon studs and the apertures therebetween. This layer 330 should be of uniform thickness on all horizontal surfaces which are exposed. The uniform thickness of the layer within the isolation regions is important in that it will be used as a polishing stop layer to stop a polishing process. As the polishing process will effectively be stopped at this uniform polishing stop layer, the polished silicon layer will effectively be defined to a layer of uniform thickness. Any method of directional deposition which results in a layer of uniform thickness on the horizontal surface can be used, for example, an evaporation process.

There are two additional constraints which must be applied to layer 330. First, as the layer 330 will be used as a polishing stop layer with which to define the polished silicon layer to a layer of uniform thickness, the conformal layer must be thinner than the thinnest portion of the silicon layer. The second constraint is that, in order to provide an etch stop to the polishing process, the layer 330 must be of a material which has a polishing rate which is substantially slower than that of silicon. Examples of materials which would provide a lower polishing rate would include refractory metals such as tungsten, molybdenum, titanium, tantalum, platinum, palladium, nickel and cobalt. In a preferred embodiment, a good material is tungsten which has a polishing rate ratio of approximately 200:1 when compared with silicon. As an example of an appropriate layer, good results have been achieved by depositing 0.2 micrometers of tungsten via an evaporation process.

Once the layer 330 has been provided as illustrated in FIG. 3C, note that the bottom surfaces of the layer 330 within the apertures or isolation regions are in contact with the top surface of the insulator layer 302. In effect, the bottom or first surfaces of the remaining silicon layer portions and the bottom or first surfaces of the conformal layer 330 lying within the isolation regions are made coplanar. Thus, as mentioned previously, the underlying insulator layer 302 is, in effect, used as a reference plane with which to register the bottom or first surfaces of the remaining silicon layer and conformal layer 330 to one another.

Then, the caps of the layer 330 which cover the silicon studs are removed along with the resist layer portions 310. In a preferred embodiment, the caps are removed because, as was mentioned above, the conformal layer 330 is a material which has a slow polishing rate. Since the next processing step to be applied is a polishing process, unnecessary time and wear to the polishing apparatus would be encountered if the polishing process were used to polish away the caps. In the preferred embodiment, the removal of the caps is accomplished via lift-off (e.g. stripping in n-methyl pyrollidone) of the resist layer 310.

The resultant silicon-on-insulator structure having the caps removed is illustrated in FIG. 3D. Note in FIG. 3D that the silicon stud 322 is slightly shorter than the silicon studs 320 and 324. This height variation is due to the original localized planar non-uniformity 306 which was described with reference to FIG. 3A. Also, note that the conformal layer 330 lying within the insulation regions is thinner than the shorter silicon stud 322.

Before a polishing process is applied, experience has shown the need for further treatment of the layer 330. During experimentations using a tungsten layer 330, it was found that, unless the tungsten was annealed to improve adhesion, large pieces of the tungsten layer would be torn off during the polishing process. Thus, in a preferred embodiment, the semiconductor structure is annealed for 5 minutes at 900° C. in a wet forming gas anneal. In addition, during subsequent experimentations applying an annealing process, it was found that, unless an insulator film (329 in FIG. 3C) was provided between the tungsten conformal layer 330 and the silicon studs, undesirable tungsten silicide would be formed. Thus, as described above, the insulator film 329 is required to protect the exposed silicon sidewalls of the silicon studs from undesirable chemical reactions.

Once the annealing process is completed, a polishing process is applied in a planar mode to the tops of the silicon studs until, in effect, an etch stop is encountered when the polishing apparatus reaches a point where it encounters the larger surface areas of layer 330 in the isolation regions. In general, the polishing process is a physical abrasion process carried out in the presence of a slurry. As an example of a suitable polishing apparatus and method, during experimentations a Rodel IC40 Polishing Pad (at a pressure of approximately 1 PSI) was used to polish the wafers in the presence of a Cabosil slurry at a PH of 10.8. "Cabosil" is the tradename of a fumed silica slurry sold by the Cabot Corp. In practice, any slurry having a high PH and having silicon, aluminium or other similar particulates should provide the general results described below.

By using resistivity measurements during experimentations, it was found that 500 Å of tungsten was removed during 7 minutes of polishing for a polishing rate of 71 Å per minute. The same polishing procedure removes 0.4 microns of polysilicon in 20 seconds, for a polishing rate of 1.33 microns per minute. These data support the calculation of a polishing rate of 200:1 for silicon to tungsten.

Once the etch-stop layer 330 is encountered and the polishing process stopped, the result is that the previous silicon studs 320, 322, and 324 have been polished down to silicon islands 370, 372, and 374 (FIG. 3E). These silicon islands 370, 372 and 374 are of uniform thicknesses which correspond to the uniform thickness of layer 330 provided in the isolation regions. Thus, it can be seen that the uniform thickness of layer 330, which was provided in the isolation regions, is used as an exclusive function with which to define the thickness uniformity of the remaining silicon layer. As the thickness of layer 330 can be highly controlled during the deposition process, the thickness of the polished silicon layers can, therefore, also be highly controlled. Thus, there is provided a method whereby a uniform layer of slow polishing material can be used to mechanically stop a polishing process, such that thicker silicon layers can be polished to a layer of uniform thickness.

Once the silicon studs 320, 322, and 324 have been polished down to silicon islands 370, 372, and 374 respectively, the remaining conformal layer 330 in the isolation regions, and the insulator films 329, are removed, thereby leaving isolated silicon islands with exposed sidewalls, thus facilitating sidewall implantation, passivation, and processing in the usual manner. In the final FIG. 3F, the conformal layer 330 and the insulator films 329 are shown removed, and the silicon islands 370, 372, and 374 have been further processed to provide the devices 390, 392, and 394, respectively.

The fabrication process of the present invention and many of its attendant advantages will be understood from the foregoing description of a preferred embodiment, and it will be apparent that various changes may be made in the form, construction and arrangement of the parts thereof, without departing from the spirit and scope of the invention which is defined and limited only by the following claims.

What is claimed is:

1. A process of planarizing a layer of material, comprising the steps of:
   patterning said layer of material to form apertures therein;
   forming in each of said apertures a polishing stop layer of uniform thickness which is thinner than said layer of material; and
   polishing said layer of material to a point where its surfaces are substantially coplanar with the surfaces of said polishing stop layer, such that said uniform thickness of said polishing stop layer is used to define said layer of material to a layer of uniform thickness.

2. A method of improving the thickness uniformity of a layer of material, comprising the steps of:
   applying a first layer of material to a support structure having a substantially planar surface to be used as a reference plane;
   providing apertures in said first layer of material to expose portions of said reference plane;
   applying to said reference plane, through each of said apertures, a conformal layer of polishing stop material of uniform thickness, the thickness of said conformal layer being thinner than said first layer of material; and
   polishing said first layer of material in a planar mode to a point where it is substantially coplanar with the surface of said polishing stop material, such that the substantially uniform thickness of said conformal polishing stop layer is used to define said first layer of material to a layer of uniform thickness.

3. A method of providing a layer of semiconductor material of uniform thickness, comprising the steps of:
   providing a layer of semiconductor material on a substrate, said material having at least a first surface and a second surface, said second surface extending above the level of said first surface;
   providing a polishing stop layer of uniform thickness having a lower surface which is substantially coplanar with said first surface of said layer of semiconductor material, said polishing stop layer being thinner than said layer of semiconductor material; and
   polishing said second surface of said layer of semiconductor material until said upper surface of said polishing stop layer is encountered, such that the uniform thickness of said polishing stop layer is used to define said layer of semiconductor material to a layer of uniform thickness.

4. A method of providing a layer of semiconductor material of uniform thickness, comprising the steps of:
   providing a layer of semiconductor material on portions of a reference plane;
   providing a polishing stop layer of substantially uniform thickness on different portions of said reference plane such that a first surface of said layer of semiconductor material and a first surface of said polishing stop layer are substantially coplanar, said polishing stop layer being thinner than said layer of semiconductor material; and
   polishing a second surface of said layer of semiconductor material in a planar mode to a point where a second surface of said polishing stop layer is encountered, such that the substantially uniform thickness of said polishing stop layer is used to define said layer of semiconductor material to a layer of uniform thickness.

5. A method of providing a layer of semiconductor material of uniform thickness, comprising the steps of:
   providing a support structure having a substantially planar surface representing a reference plane;
   providing a layer of semiconductor material on portions of said reference plane;
   providing a polishing stop layer of substantially uniform thickness on different portions of said reference plane such that a first surface of said semiconductor material and a first surface of said polishing stop layer are substantially coplanar, said polish stop layer being thinner than said layer of semiconductor material; and
   polishing a second surface of said layer of semiconductor material in a planar mode to a point where a second surface of said polishing stop layer is encountered, such that the substantially uniform thickness of said polishing stop layer is used to define said semiconductor material to a layer of substantially uniform thickness.

6. A method of providing a layer of semiconductor material of uniform thickness, comprising the steps of:
   providing a layer of semiconductor material on portions of a reference plane, leaving other portions of said reference plane exposed;
   applying a conformal polishing stop layer of a substantially uniform thickness to said exposed portions of said reference plane, such that a first surface of said layer of semiconductor material and a first surface of said conformal polishing stop layer are substantially coplanar, said conformal polishing stop layer being thinner than said semiconductor material; and polishing a second surface of said layer of semiconductor material in a planar mode to a point where a second surface of said conformal stop layer is encountered, such that the substantially uniform thickness of said conformal stop layer is used to define said semiconductor material to a layer of substantially uniform thickness.

7. A method of providing a layer of semiconductor material of uniform thickness, comprising the steps of:
providing a layer of semiconductor material on portions of a reference plane, leaving other portions of said reference plane exposed;
applying a conformal polishing stop layer of a substantially uniform thickness upon said semiconductor material and said exposed portions of said reference plane, such that a first surface of said layer of semiconductor material and a first surface of said conformal polishing stop layer on said exposed portions of said reference plane are substantially coplanar, said conformal polishing stop layer being thinner than said semiconductor material;
removing portions of said conformal polishing stop layer from a second surface of said layer of semiconductor material; and
polishing said second surface of said layer of semiconductor material to a point where a second surface of said conformal polishing stop layer on said exposed portions of said reference plane is encountered, such that the substantially uniform thickness of said conformal polishing stop layer on said exposed portions of said reference plane are used to define said semiconductor material to a layer of uniform thickness.

8. A method of providing a layer of semiconductor material of uniform thickness, as claimed in claim 7, wherein said polishing step comprises a physical abrasion process carried out in the presence of a slurry.

9. A method providing a layer of semiconductor material of uniform thickness, as claimed in claim 8, wherein said slurry has a pH of greater than 7.

10. A method of providing a layer of semiconductor material of uniform thickness, as claimed in claim 9, wherein said slurry has silicon particulates.

11. A method of providing a layer of semiconductor material of uniform thickness, as claimed in claim 8, wherein said semiconductor material is silicon, and wherein said polishing stop layer is composed of a material which has polishing rate which is substantially slower than that of silicon.

12. A method of providing a layer of semiconductor material of uniform thickness, as claimed in claim 7, wherein said polishing stop layer is selected from the group consisting of tungsten, millennium, titanium, tantalum, platinum, palladium, nickel and cobalt.

13. A method of providing a layer of semiconductor material of uniform thickness, as claimed in claim 7, wherein said polishing stop layer is made of tungsten.

14. A method of providing a layer of semiconductor material of uniform thickness, as claimed in claim 13, wherein said polishing stop layer is subject to an annealing process prior to said polishing step.

15. A method of providing a layer of semiconductor material of uniform thickness, as claimed in claim 7, wherein said reference plane is the surface of a silicon dioxide layer.

16. A method of providing a layer of semiconductor material of uniform thickness, as claimed in claim 7, wherein said polishing stop layer is applied by evaporation.

17. A method of providing a layer of semiconductor material of uniform thickness, as claimed in claim 7, comprising the step of providing an insulator film on exposed portions of said semiconductor material before said applying step, to prevent chemical reaction between said semiconductor material and material of said polishing stop layer.

18. A method of providing a layer of semiconductor material of uniform thickness, as claimed in claim 7, wherein said portions of said polishing stop layer are removed from said second surface of said layer of semiconductor material by using a lift-off process.

19. A method of providing a layer of semiconductor material of uniform thickness, as claimed in claim 7, wherein said layer of semiconductor material on the portions of the reference plane are provided in the form of semiconductor studs separated by isolation regions.

20. A method of providing a layer of semiconductor material of uniform thickness, as claimed in claim 7, wherein said layer of semiconductor material on the portions of the reference plane are provided in the form of semiconductor bodies bordered by isolation regions.

21. A method of providing a layer of semiconductor material of uniform thickness, as claimed in claim 7, wherein said layer of semiconductor material on the portions of the reference plane are provided in the form of semiconductor sheets separated by isolation regions.

22. A method of providing a layer of semiconductor material of uniform thickness, as claimed in claim 7, wherein said layer of semiconductor material on the portions of the reference plane are provided in the form of semiconductor strips separated by isolation regions.

23. A method as claimed in claim 7 further comprising the step of removing the remaining portions of said stop layer from said reference plane.

* * * * *